United States Patent [19]

Kawano

[11] Patent Number: 5,463,309
[45] Date of Patent: Oct. 31, 1995

[54] VARIABLE VOLTAGE TO CURRENT CONVERSION CIRCUIT

[75] Inventor: Mitsumo Kawano, Saitama, Japan

[73] Assignee: Kabushiki Kaisha Toshiba, Kawasaki, Japan

[21] Appl. No.: 124,008

[22] Filed: Sep. 21, 1993

[30] Foreign Application Priority Data

Sep. 21, 1992 [JP] Japan ................... 4-251392

[51] Int. Cl.$^6$ .................................................. G05F 3/16
[52] U.S. Cl. .................................... 323/315; 327/538
[58] Field of Search ................... 323/312, 315, 323/316; 363/73; 327/530, 538, 542, 543

[56] References Cited

U.S. PATENT DOCUMENTS

| | | |
|---|---|---|
| 3,533,007 | 10/1970 | Segar . |
| 4,004,247 | 1/1977 | Van De Plassche ............ 330/30 D |
| 4,442,400 | 4/1984 | Nagano ............................ 323/315 |
| 4,647,839 | 3/1987 | Siligoni et al. ................. 323/312 |
| 4,682,098 | 7/1987 | Seevinck et al. ............... 323/315 |
| 4,689,580 | 8/1987 | Fukuda et al. .................. 330/306 |
| 4,961,046 | 10/1990 | De Jager ......................... 323/315 |
| 5,223,743 | 6/1993 | Nakagawara ................... 307/296.1 |

FOREIGN PATENT DOCUMENTS 0481631  4/1992  European Pat. Off. .
61-224715  10/1986  Japan .

OTHER PUBLICATIONS

Fukuda et al, "New Video Singal Processing LSIs for 8MM VCRs", IEEE Transactions on Consumer Electronics, vol. 34, No. 3, Aug. 1988, New York, pp. 543–550.

Primary Examiner—Peter S. Wong
Assistant Examiner—Adolf Berhane
Attorney, Agent, or Firm—Cushman Darby & Cushman

[57] ABSTRACT

A variable voltage to current conversion circuit having a first transistor and a second transistor having bases which are supplied with differentially related voltage, a diode-fashion third transistor having a base and a collector commonly connected to the emitter of the first transistor through a first resistor, a diode-fashion fourth transistor having a base and a collector commonly connected to the emitter of the second transistor through a second resistor, a first current source coupled to a connection node of the emitters of the third and the fourth transistors, a fifth and a sixth transistors having bases connected to the collectors of the third and the fourth transistors, respectively, and emitters commonly connected to a second current source, and a third current source coupled to the connection node of the collectors of the second and the sixth transistors.

5 Claims, 2 Drawing Sheets

VARIABLE VOLTAGE TO CURRENT CONVERSION CIRCUIT

FIELD OF THE INVENTION

The present invention relates generally to a variable voltage to current conversion circuit, and more particularly, to a variable voltage to current conversion circuit for suitable for use in an active filter.

BACKGROUND OF THE INVENTION

Conventional filters for use in electrical circuits such as filters are typically constructed in LC circuits by using inductor and capacitor elements. In recent years, a miniaturization of circuits has been increasingly demanded, with the advancement of integrating technology. To cope with such a demand, an active filter which may be incorporated in such an integrated circuit has been developed. In order to construct this type of filter, a filter time constant must be set using a resistance and a capacitance. However, devices which define the time constant are not sufficiently precise in the interior of an IC. Therefore, an accuracy of the time constant is increased by making a current flowing through the devices, etc. be variable. As a circuit which is most effective for varying the current, there is known a voltage to current conversion circuit called as a Gilbert cell or a Gilbert circuit.

FIG. 1 shows a typical example of the variable voltage to current conversion circuit using the Gilbert cell.

In FIG. 1, differently related voltages V1 and V2 are supplied to input terminals 11 and 12, respectively. The input terminals 11 and 12 are connected to the bases of differentially paired transistors Q1 and Q2. The collector of the transistor Q1 is connected to power line Vcc, while its emitter is connected to the connection node of the collector and the base of a diode-fashion transistor Q3 and also to the base of a transistor Q5, through a resistor R11. The collector of the transistor Q2 is connected to the power line Vcc, while its emitter is connected to the connection node of the collector and the base of a diode-fashion transistor Q4 and also to the base of a transistor Q6, through a resistor R12. The emitters of the transistors Q3 and Q4 are grounded commonly through a current source I11. Also the common node of the emitters of the transistors Q5 ans Q6 is grounded through a current source I12. The collector of the transistor Q5 is connected to the power line Vcc. While the collector of the transistor Q6 is connected to the power line Vcc, and also to an output terminal 13.

In the variable voltage to current conversion circuit as described above, a differential input is given by Vin (Vin=V1−V2). A current flowing through the transistor Q1 is given by i1. A current flowing through the transistor Q2 is given by −i1. Further, a current flowing through the transistor Q5 is given by i2. A current flowing through the transistor Q6 is given by −i2. And a potential difference ΔV between the bases of the transistors Q5 and Q6 will be in the relation shown by the following equation:

$$\begin{aligned}\Delta V &= Vt \cdot \mathrm{Log} - n\left[\{i11/2 + i1\}/is\right] - \\ & \quad Vt \cdot \mathrm{Log} - n\left[\{i11/2 - i1\}/is\right] \\ &= Vt \cdot \mathrm{Log} - n\left[\{i12/2 + i2\}/is\right] - \\ & \quad Vt \cdot \mathrm{Log} - n\left[\{i12/2 - i2\}/is\right]\end{aligned} \quad (1)$$

In the equation (1), the Vt is a thermal voltage constant, the is is a transistor saturation current having the same value over all transistors. Under the balanced state (ΔV=0), currents i11 and i12 supplied from the current sources I11 and I12 differentially flow by each the ½ of the total currents. From the equation (1), the current i2 given as the following equation (2).

$$i2 = (i12/i11)i1 \quad (2)$$

On the other hand, when the equivalent emitter resistances of the transistors Q1, Q2, Q3 and Q4 are all given as re, the current i1 is obtained from the following equation.

$$i1 = Vin/(r11 + r12 + 4re) \quad (3)$$

In the equation (3), the r11 and r12 represent the resistance of the resistors R11 and R12. Also the re represents the emitter resistance of the transistors. From the equations (1) and (2), the current i2 is given by the following equation.

$$i2 = Vin/\{(r11 + r12 + 4re)(i11/i12)\} \quad (4)$$

This will become almost an output current. As seen from the equation (4), to vary the resistance component (r11+r12+4re)(i11/i12) constituting the filter time constant using a voltage to current converter, it is possible to change the current i12 of the current source I12.

In the circuit described above, the transistors Q3 through Q6 comprise a Gilbert cell and this Gilbert cell is ideally used as a convenient current converter as shown in equation (2). However, there this circuit experiences such large problems. For instance, as P-N junction logarithmic compressed voltage output by the transistors Q3 and Q4 was exponentially expanded by the transistors Q5 and Q6, it was largely affected by the characteristics of semiconductors. Thus mixing of noise is unavoidable and DC balance is bad. In particular, when composing an active filter, an S/N ratio is deteriorated largely as signal must go through this type of circuit, being adjusted by the amount of the circuits corresponding exponent. The smaller a signal level is, the more this phenomenon becomes disadvantageous. On the contrary, however, when a signal level is increased, distortion will increase as a gap between a logarithmic and exponential correction appears intensely.

When a signal is passed through a voltage to current converter which uses a Gilbert cell as described above, a S/N ratio is deteriorated, and a DC balance is deteriorated too.

SUMMARY OF THE INVENTION

It is therefore an object of the present invention to provide a variable voltage to current conversion circuit which is capable of largely reducing characteristic deterioration caused by a Gilbert cell.

In order to achieve the above object, a variable voltage to current conversion circuit according to one aspect of the present invention includes a first transistor and a second transistor having bases to be supplied with differentially related voltages, a diode-fashion third transistor having a base and a collector commonly connected to the emitter of the first transistor through a first resistor, a diode-fashion fourth transistor having a base and a collector commonly connected to the emitter of the second transistor through a second resistor, a first current source coupled to a common node of the emitters of the third and the fourth transistors, a fifth and a sixth transistors having bases connected to the collectors of the third and the fourth transistors, respectively, and emitters commonly connected to a second current source, and a third current source coupled to the common node of the collectors of the second and the sixth transistors.

According to the above construction, an output current from the output section is composed of a signal component passing through a path having characteristics of a logarithmic compression and an exponential expansion by semiconductor characteristics, and a signal component simply current-converted through the collector of the second transistor. Thus the deterioration of the signal component experienced because of the logarithmic compression and the exponential expansion is decreased.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
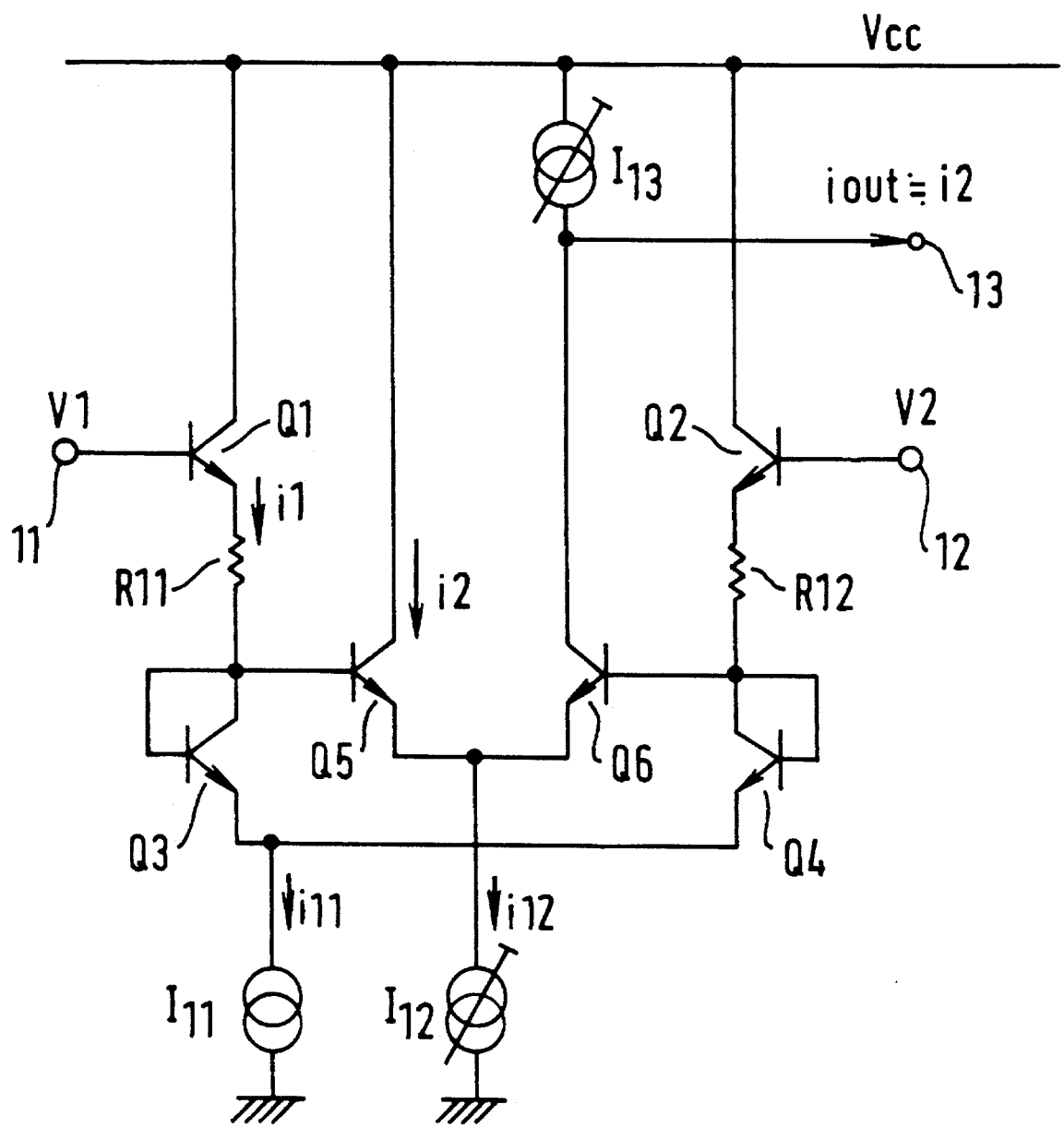
FIG. 1 is a circuit diagram showing a conventional variable voltage to current conversion circuit.
Figure 2:
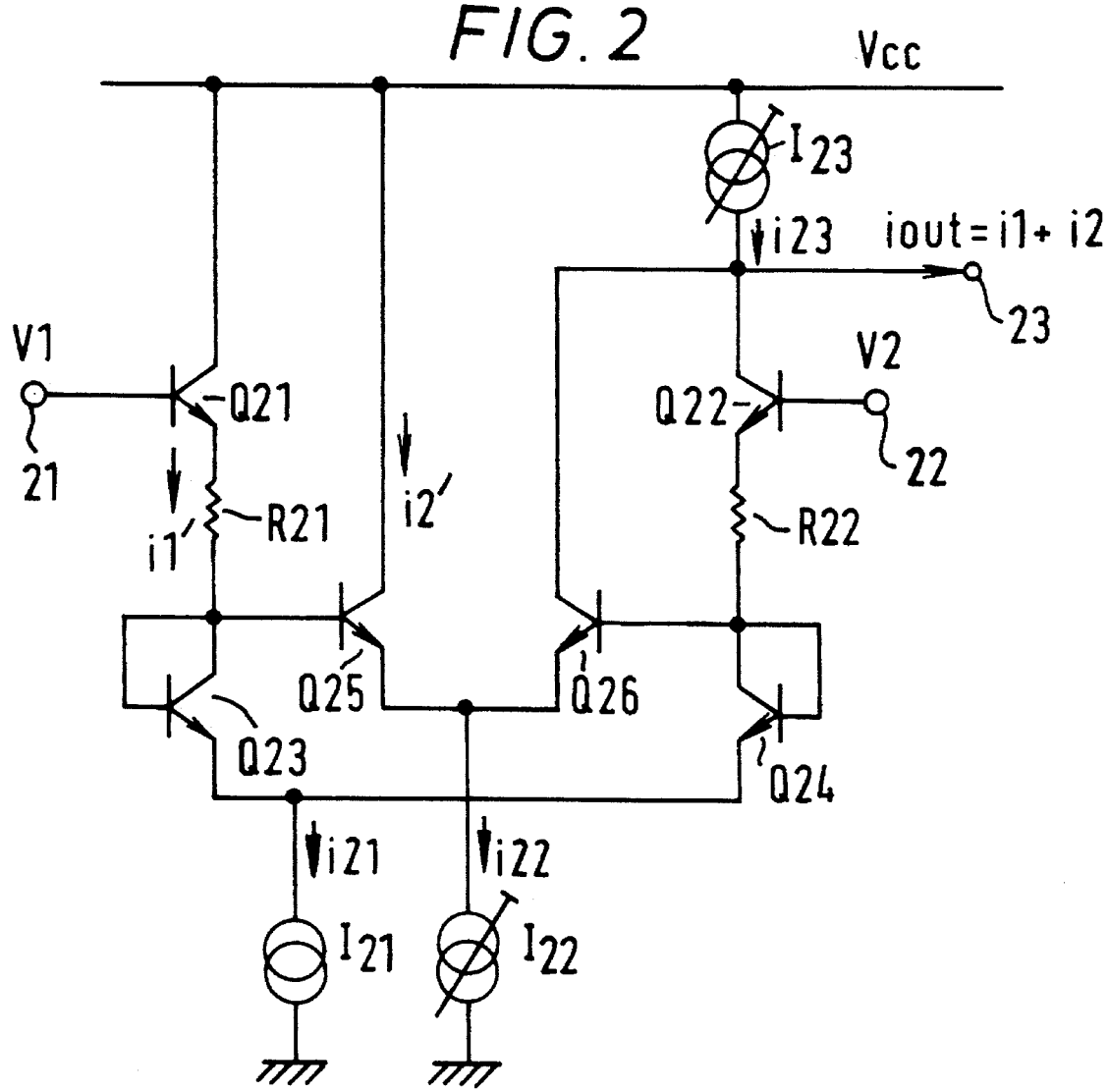
FIG. 2 is a circuit diagram showing a preferred embodiment of the present invention.
Figure 3:
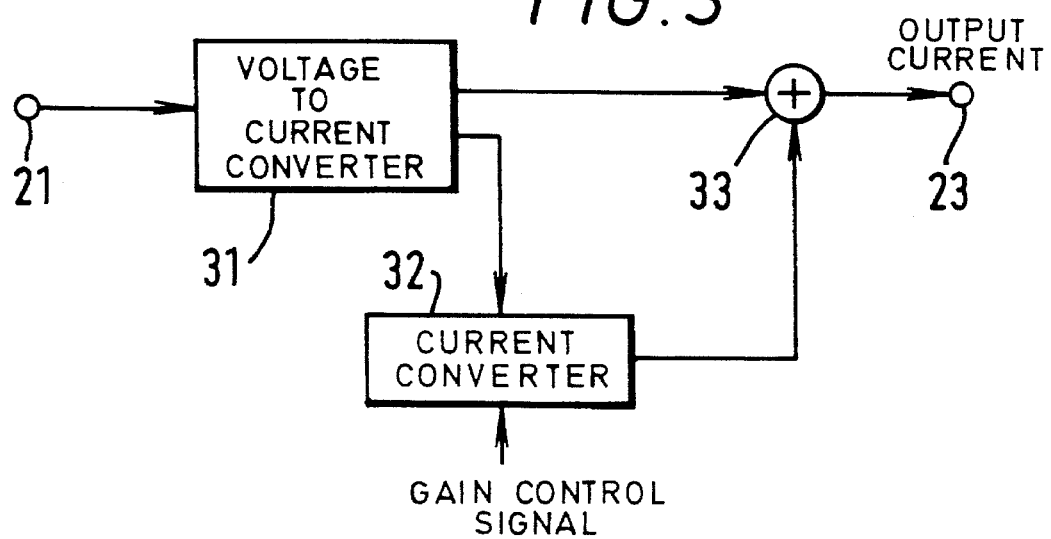
FIG. 3 is a block diagram representation of the circuit as shown in FIG. 2.

Referring now to FIGS. 2 and 3, a preferred embodiment of the variable voltage to current conversion circuit according to the present invention will be described in detail. FIG. 2 shows a preferred embodiment of the present invention, while FIG. 3 shows a block diagram representation of the circuit of FIG. 2.

In FIG. 2, input terminals 21 and 22 are supplied with differentially related voltages V1 and V2. The input terminals 21 and 22 are connected to the bases of a differentially paired transistors Q21 and Q22. The collector of transistor Q21 is connected to a power line Vcc. The emitter of transistor Q21 is connected to the connection node of the collector and the base of a diode-fashion transistor Q23 and to the base of a transistor Q25 through a resistor R21. The collector of transistor Q22 is connected not only to the power line Vcc through a current source I23 but also to an output terminal 23. The emitter of the transistor Q22 is connected to the common node of the collector and the base of a diode-fashion transistor Q24 and also to the base of a transistor Q26, through a resistor R22. The emitters of the transistors Q23 and Q24 are grounded commonly through the current source I21. Also the emitters of the transistor Q25 and Q26 are grounded commonly through a current source I22. The collector of the transistor Q25 is connected to the power line Vcc, while the collector of the transistor Q26 is connected to the collector of the transistor Q22.

The circuit described above is represented by a block diagram as shown in FIG. 3. A section composed of the transistors Q21, Q23, Q24 and Q22 forms a voltage to current converter 31, a section composed of the transistors Q23, Q25, Q26 and Q24 forms a current converter 32, and the connection node of the collectors the transistors Q26 and Q22 forms an adder 33.

In this circuit, a current i23 supplied from the current source I23 is set at i23=(i21+i22)/2. When assuming that a current flowing through the transistor Q21 is i1', a current flowing through the transistor Q25 is i2', and the differential input is given by Vin (Vin=V1−V2), the following equations are obtained from the above equations (2) and (3).

$$i2'=(i22/i21)i1' \quad (5)$$

$$i1'=Vin/(r21+r22+4re) \quad (6)$$

An output current Iout at this time is expressed as follows:

$$\begin{aligned} iout &= i1' + i2' \\ &= \{1 + (i22/i21)\}\{Vin/(r11 + r12 + 4re)\} \end{aligned} \quad (7)$$

[0015]

Therefore, a resistance component, i.e., an element of the filter time constant can be adjusted through the adjustments of the currents supplied by the current sources. Though a variable range becomes narrow since the equation (7) contains fixed terms, a narrower variable range is rather advantageous for the purpose of correcting the dispersion of the filter time constant.

Now the operation of this circuit will be described in comparison with the conventional circuit.

To obtain a constant which makes the mean value of the time constant equal to that of the conventional circuit, it is sufficient when i2=iout is valid in the relation between the equations (5) and (7). When the resistance re is sufficiently smaller than the resistances r21 and r22 and the resistances r21 and r22 are equal to those of the resistors R11 and R12 in the conventional circuit, as shown in FIG. 2, the mean value of the time constant will become the same as that of the conventional circuit from the following equation.

$$(i12/i11)r21=\{1+(i21/i22)\}r11 \quad (8)$$

Here, a case where i11=i12 and i2'=(⅓)i1' are valid between the currents will be considered. In this case, the r21 becomes equal to (4/3)r11. In order to make the input dynamic range equal to that of the conventional circuit, the i1' should be made equal to (¾)i11. The sum of the currents of the current sources in the conventional circuit is given by i11+i12=2i11, while in the circuit of this embodiment the sum of the currents of the current sources are given by i21+i22=(4/3)i21=i11. That is, even when the dynamic range is made equal to that of the conventional circuit, the sum of the currents of the current sources is reduced to a half of that of the conventional circuit. This is because the collector current of the transistor Q22, which is not used in the conventional circuit, is effectively utilized in the embodiment. This collector current of the transistor Q22 is simply converted from the input voltage. On the other hand, the original output of the Gilbert cell presents on the collector of the transistor Q22 after experienced the operations of the logarithmic compression and the exponential expansion. This current component contains a noise caused by semiconductor characteristics, resulting in deterioration of the S/N ratio as described for the conventional circuit. In this circuit, however, the output current iout is not composed of only the output of the Gilbert cell, but contains the output due to the simple voltage to current conversion at the transistor Q22. As a result, the signal component deteriorated after the operations of the logarithmic compression and the exponential expansion has been suppressed to the ¼ of the entire output. The variable range of the output current at this time becomes +/−(¼), that is, +/−25% (the range can be still expanded in the+side) but this is sufficient enough for practical use. Though the output of the Gilbert cell is directly affected by the paired transistors and its DC balance is insufficient, in the case of the circuit of this embodiment the collector current of the transistor Q22 is almost defined by the ratio of the resistances r21 and r22 and also it is possible to improve its stability. This will be extremely effective, especially when realizing a higher order low pass filter with DC transmission characteristics.

As described above, the present invention can provide an extremely preferable variable voltage to current conversion circuit without an increase of the number of elements in the circuit configuration. The present invention is also possible to largely reduce the deterioration of the characteristic of the Gilbert cell, and to improve the noise, the distortion, the DC fluctuation and the deterioration of the signal. Furthermore, the present invention is possible to accomplish a variable voltage to current conversion circuit effective in reducing a current consumption.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A variable voltage to current conversion circuit comprising:
   a voltage to current converter;
   a gain controllable current converter coupled to the voltage to current converter; and
   an adder for summing currents generated by the voltage to current converter and the gain controllable current converter and for generating an output current based on the summed currents.

2. A variable voltage to current conversion circuit, comprising:
   a first transistor and a second transistor having bases which are supplied with differentially related voltages;
   a diode-fashion third transistor having a base and a collector commonly connected to an emitter of the first transistor through a first resistor;
   a diode-fashion fourth transistor having a base and a collector commonly connected to an emitter of the second transistor through a second resistor;
   a first current source coupled to a connection node of emitters of the third and the fourth transistors;
   a fifth and a sixth transistors respectively having bases connected to the collectors of the third and the fourth transistors, and emitters commonly connected to a second current source, a collector of the sixth transistor being connected to a collector of the second transistor at a connection node; and
   a third current source coupled to the connection node of the collectors of the second and sixth transistors, wherein
   an output is generated at the connection node of the collectors of the second and sixth transistors.

3. A variable voltage to current conversion circuit as claimed in claim 2, wherein the resistances of the first and the second resistors are larger than the emitter resistances of the first and second transistors, respectively.

4. A variable voltage to current conversion circuit as claimed in claim 2, wherein the first and the second current sources includes variable current sources, respectively.

5. A variable voltage to current conversion circuit comprising:
   a voltage to current converter, including:
      differentially related input means,
      a first and second transistors having bases receiving differentially related voltages from the input means,
      a diode-fashion third transistor having a base and a collector commonly connected to the emitter of the first transistor through a first resistor,
      a diode-fashion fourth transistor having a base and a collector commonly connected to the emitter of the second transistor through a second resistor, and
      a first current source coupled to a connection node of the emitters of the third and the fourth transistors;
   a gain controllable current converter coupled to the voltage to current converter, the gain controllable current converter including:
      the diode-fashion third and fourth transistors, the diode-fashion third and fourth transistors and the first current source being shared with the voltage to current converter, and
      a fifth and sixth transistors having bases connected to the collectors of the third and fourth transistors, respectively, and emitters commonly connected to a second current source; and
   an adder for receiving input from the voltage to current converter and the gain controllable current converter and for generating an output based on the received input, the adder including a third current source coupled to a connection node of the collectors of the second and sixth transistors.

* * * * *